(12) United States Patent
Kawashima

(10) Patent No.: US 6,545,394 B2
(45) Date of Patent: Apr. 8, 2003

(54) LAME MODE QUARTZ CRYSTAL RESONATOR

(75) Inventor: Hirofumi Kawashima, Tokyo (JP)

(73) Assignee: Piedek Technical Laboratory & Quark Crystal Technical Laboratory Inc., Tokyo (JP)

( * ) Notice: Subject to any disclaimer, the term of this patent is extended or adjusted under 35 U.S.C. 154(b) by 0 days.

(21) Appl. No.: 09/837,528

(22) Filed: Apr. 18, 2001

(65) Prior Publication Data

US 2002/0060509 A1 May 23, 2002

(30) Foreign Application Priority Data

Nov. 17, 2000 (JP) ........................................ 2000-351384

(51) Int. Cl.⁷ .............................................. H01L 41/08
(52) U.S. Cl. ........................ 310/361; 310/366; 310/367
(58) Field of Search ................................. 310/360, 361, 310/367, 368, 366

(56) References Cited

U.S. PATENT DOCUMENTS

| | | | | |
|---|---|---|---|---|
| 4,178,566 A | * | 12/1979 | Kawashima | 310/366 X |
| 4,450,378 A | * | 5/1984 | Hermann et al. | 310/361 |
| 4,486,682 A | * | 12/1984 | Nakazawa et al. | 310/361 |
| 4,503,353 A | * | 3/1985 | Hermann et al. | 310/361 |
| 4,772,130 A | * | 9/1988 | Ueda et al. | 310/361 X |
| 5,274,297 A | * | 12/1993 | Hermann et al. | 310/361 |

FOREIGN PATENT DOCUMENTS

| | | | | |
|---|---|---|---|---|
| JP | 10-327038 | 12/1998 | | H03H/9/17 |

OTHER PUBLICATIONS

Handbook of Piezoelectric Crystals, pp 9–24 J. Buchanan, Dec. 1954.*

Kawashima, H.; Kanie, H; Yamagata, S.; "Quartz Microresonator Temperature Sensors Using Lamé–Made" European Frequency and Time Forum, 1999 anda the IEEE International Frequency Control symposium, Proceedings of the 1999 Joint Meeting of the, vol. 2, 1999 p. 1049–1053.

Kawashima, H.; Matsuyama, M; Sunaga, K.; "Lamé–Mode Quartz Crystal Resonators" Frequency Control symposium, 1996. 50th., Proceedings of the 1996 IEEE International., pp. 416–421.

Hirofumi Kawashima, Masaru Matsuyama; Analysis of Doubly Rotated Lamé–Mode Piezoelectric Resonators by the Energy Method, 1997, vol. 80, No. 4, p. 21–29 English translation and Japanese language original.

JPO office action of Apr. 16 citing above references 1–4.

* cited by examiner

Primary Examiner—Mark O. Budd
(74) Attorney, Agent, or Firm—Abelman, Frayne & Schwab

(57) ABSTRACT

The Lame mode quartz crystal resonator vibrating in overtone mode is formed of an X-plate quartz crystal obtained in a manner that a blank X-plate quartz crystal having a coordinate of x, y and z axes is rotated through 36.5° to 47° about its y-axis and further rotated through 65° to 85° about a new x'-axis corresponding to the x-axis produced by the rotation about the y-axis and the thus rotated blank X-plate quartz crystal is then cut out along planes parallel to x-y, y-z and z-x planes of the original coordinate system, respectively. The quartz crystal resonator includes a vibrating portion, a supporting frame and a mounting portion formed integrally. The vibrating portion is connected through two connecting portions to the supporting frame and the mounting portion, as a result of which the quartz crystal resonator has less series resistance $R_1$ and exhibits minimum vibrational energy losses and minimum frequency change over a wide temperature range.

12 Claims, 15 Drawing Sheets ized, to operate with high accuracy and to be
LAME MODE QUARTZ CRYSTAL RESONATOR

FIELD OF THE INVENTION

This invention relates to a Lame mode quartz crystal resonator including a quartz crystal obtained by cutting out a blank quartz crystal along particular planes, and more particularly to a Lame mode quartz crystal resonator most suitable as a reference signal source for use in portable instruments such as IC cards strongly required to be miniaturmanufactured inexpensively.

BACKGROUND OF THE INVENTION

An outline of Lame mode quartz crystal reson Resonators and Devices" which is a thesis written b application in the Transaction of "the Institute of Communication Engineers", vol. J82-C–I, No. 12 (December 1999), pages 667 to 682.

FIG. 7 illustrates well-known cutting directions of a quartz crystal structure of a Lame mode quartz crystal resonator with respect to the coordinate system o-xyz of the crystal structure. In the drawing, axes x', y', z' and z" are coordinate axes after the coordinate system has been rotated (crystal axes after being cut). The cutting directions are obtained by rotating a Y-plate quartz crystal through an angle of $\phi_y$ about the x-axis and then rotating the Y-plate quartz crystal through an angle of $\theta_y$ about the new axis y' corresponding to the y-axis produced by the rotation about the x-axis.

FIG. 8 illustrates a relation between the cut angles $\phi_y$ and $\theta_y$ of the quartz crystal for the Lame mode quartz crystal resonator of the prior art, giving a zero temperature coefficient. As shown in the curve 102, the cutting angle $\theta_y$ of the Lame mode quartz crystal resonator of the prior art exists within 30° to 60°.

FIG. 9 illustrates the relation between the cutting angle $\theta_y$ and the second order temperature coefficient β with the cutting angle $\theta_y$ being within the range in FIG. 8. As shown in the curve 103 in FIG. 9, when the cutting angle $\theta_y$ is 45°, the second order temperature coefficient β is $-5.4 \times 10^{-8}/°C.^2$ whose absolute value is very large. As the cutting angle $\theta_y$ varies from 45°, the absolute value of the second order temperature coefficient β becomes smaller as shown in the curve 103 in FIG. 9. At the cutting angle $\theta_y$ of 30° or 60°, β becomes $-4.5 \times 10^{-8}/°C.^2$.

FIG. 20 illustrates a Lame mode quartz crystal resonator using the quartz crystal 200 of the prior art described above, which includes a vibrating portion 207, supporting frames 201 and 213 and a mounting portion 202. Disposed on the vibrating portion 207 are electrodes 208, 209 and 210, which have electrode terminals 211 and 212 at the mounting portions 202. (Also disposed on the rear side of the vibrating portion are electrodes, which are not visible in FIG. 20.) Among these electrodes, two electrodes adjacent each other on the same side or two electrodes positioned aligned on front and rear sides form the different polarity. Moreover, the vibrating portion 207 is connected through connecting portions 203 and 206 to the supporting frames 213 and 201 and connected through connecting portions 204 and 205 to the supporting frames 213 and 201 and the mounting portion 202.

With this arrangement, however, as such a quartz crystal has the very large second order temperature coefficient β described above, it would be impossible to obtain a Lame mode quartz crystal resonator having less frequency change over a wide temperature range. Accordingly, there has been a remaining problem to be solved to realize a Lame mode quartz crystal resonator having a smaller second order temperature coefficient β.

Moreover, as the Lame mode quartz crystal resonator of the prior art includes the vibrating portion connected through the connecting portions at its four ends to the supporting frames and the mounting portion described above, the vibrating portion suffers from increased energy losses upon vibrating, as a result of which its series resistance $R_1$ increases and quality factor Q decreases as remaining problems to be solved. Consequently, it has been expected to provide a novel Lame mode quartz crystal resonator minimizing the energy losses at a vibrating portion.

SUMMARY OF THE INVENTION

It is an object of the invention to provide an improved Lame mode quartz crystal resonator which eliminates all the disadvantages of the prior art described above and which has small second order temperature coefficient β and is adapted to minimize energy losses at its vibrating portion leading to lower series resistance $R_1$ higher quality factor Q.

In order to accomplish this object, the Lame mode quartz crystal resonator vibrating in two vibrations in different phases according to the invention is formed of an X-plate quartz crystal obtained in a manner that a blank X-plate quartz crystal having a coordinate system consisting of x, y and z axes is rotated through 36.5° to 47° about its y-axis and further rotated through 65° to 85° about a new x'-axis corresponding to said x-axis produced by said rotation about said y-axis, and the thus rotated blank X-plate quartz crystal is then cut out along planes parallel to x-y, y-z and z-x planes of the original coordinate system, respectively.

In another aspect of the invention, the Lame mode quartz crystal resonator vibrating in overtone mode includes a vibrating portion, a supporting frame and a mounting portion formed integrally, and the vibrating portion is connected through two connecting portions to the supporting frame and the mounting portion.

In this manner, the invention provides the Lame mode quartz crystal resonator using the quartz crystal cut in a novel fashion exhibits a small second order temperature coefficient β, and owing to the two connecting portions for connecting the vibrating portion and supporting frame, a micro-miniature Lame mode quartz crystal resonator can be obtained which has less vibrational energy losses at the vibrating portion and a smaller series resistance $R_1$.

The overtone Lame mode quartz crystal resonator having the quartz crystal cut in the novel manner has following significant effects.

(1) With the overtone Lame mode quartz crystal resonator according to the invention, the second order temperature coefficient β is $-1 \times 10^{-8}/°C.^2$ whose absolute value is very small. Therefore, the invention can provide a Lame mode quartz crystal resonator whose frequency change is minimized over a wide temperature range.

(2) According to the invention, two connecting portions are provided for connecting the vibrating portion and the support frame, thereby minimizing the vibrational energy losses, as a result of which a Lame mode quartz crystal resonator having a lower series resistance $Q_1$ and a high quality factor Q can be obtained.

(3) According to the invention it is possible to form integrally the vibrating portion, the supporting frame, the mounting portion and the connecting portions so that a quartz crystal resonator can be realized which is miniaturized, inexpensive and beneficial to mass production because a number of resonators on a quartz crystal wafer can be simultaneously treated in a batch.

(4) The invention can produce the quartz crystal resonator formed integrally by the chemical etching process so that a Lame mode quartz crystal resonator can be realized which is superior in shock resistance.

The invention will be more fully understood by referring to the following detailed specification and claims taken in connection with the appended drawings.

DETAILED DESCRIPTION OF PREFERRED EMBODIMENTS OF THE INVENTION

Embodiment 1

Figure 1:
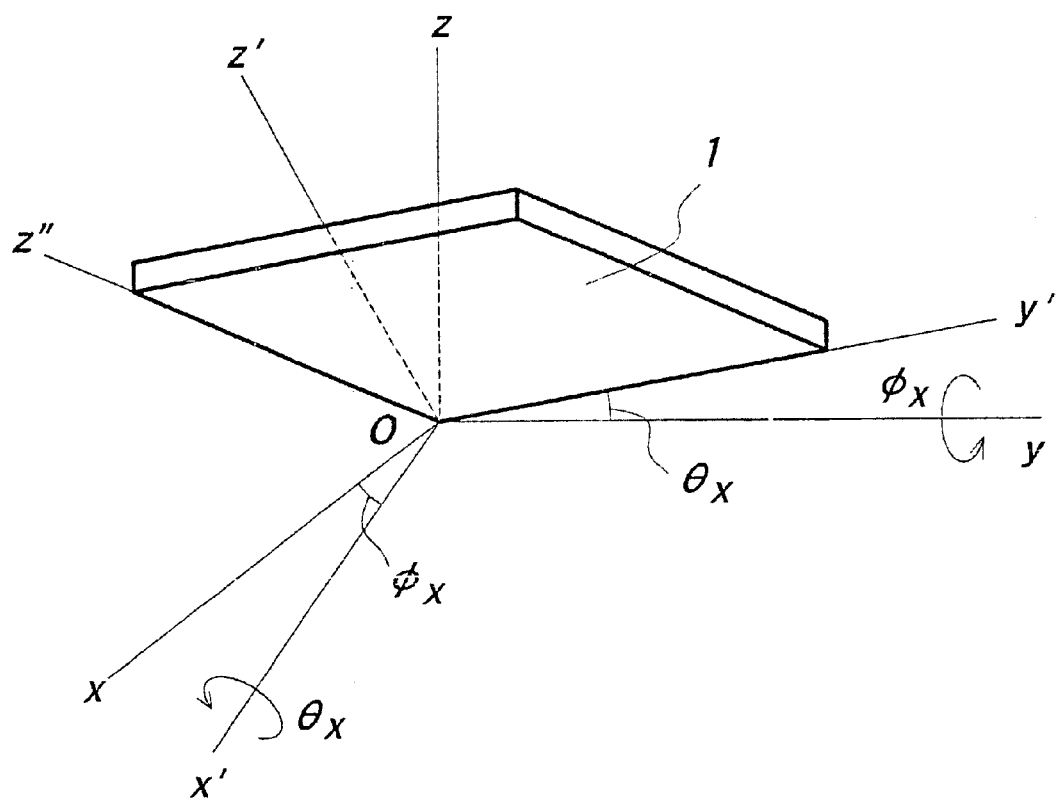
FIG. 1 is an explanatory view illustrating a quartz crystal plate from which the Lame mode quartz crystal resonator according to the invention is formed, and its coordinate.

FIG. 1 illustrates a quartz crystal plate 1 from which a Lame mode quartz crystal resonator according to the invention is cut out, and its coordinate system. The coordinate system of the quartz crystal structure consists of an original point O, an electrical axis x, a mechanical axis y and an optical axis z to constitute a coordinate system O-xyz. The X-plate quartz crystal is rotated through an angle $\phi_x$ about the y-axis, and further rotated through an angle $\theta_x$ about a new axis x' produced by the rotation about y-axis. The Lame mode quartz crystal resonator according to the invention is formed of a quartz crystal plate obtained in a manner that the thus rotated blank quartz crystal plate is cut out in planes parallel to x-y, y-z and z-x planes of the original coordinate system, respectively.

Figure 2:
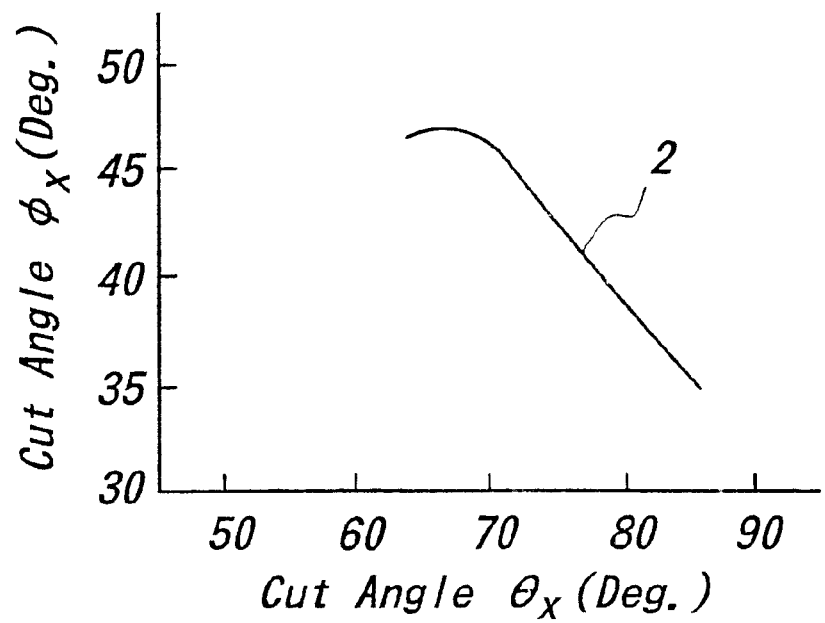
FIG. 2 is a diagram illustrating a relation between cutting angles $\phi_x$ and $\theta_x$ to obtain the zero temperature coefficient (first order temperature coefficient is zero) of the Lame mode quartz crystal resonator according to the invention.

FIG. 2 illustrates a relation between the cut angles $\phi_x$ and $\theta_x$ which are able to give the zero temperature coefficient (first order temperature coefficient being zero) to the Lame mode quartz crystal resonator according to the invention. As show in a curve 2 in FIG. 2, it is evident that the zero temperature coefficient exists within a range of 36.5° to 47° of the angle $\phi_x$ and 65° to 85° of the angle $\theta_x$.

Figure 3:
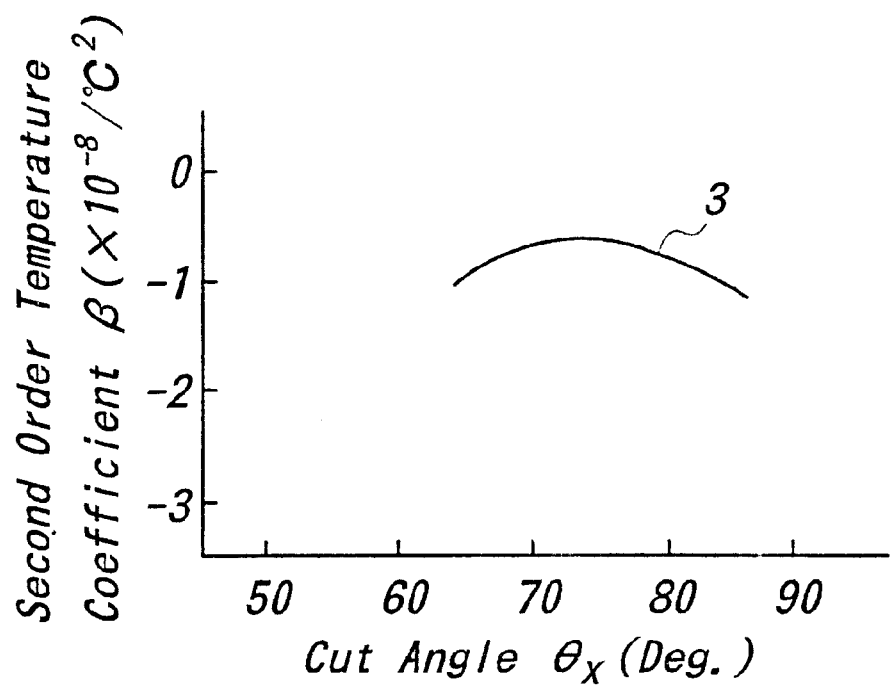
FIG. 3 is a diagram illustrating the relation between the cutting angles $\theta_x$ and second order temperature coefficient $\beta$ according to the invention.

FIG. 3 illustrates a relation between the cut angle $\theta_x$ and a second order temperature coefficient $\beta$ under the relation shown in FIG. 2. As shown in a curve 3 in FIG. 3, it is evident that the second order temperature coefficient $\beta$ is approximately $-1 \times 10^{-8}/°C.^2$ within the range of 65° to 85° of the angle $\theta_x$ corresponding to 36.5° to 47° of the angle $\phi_x$, and the absolute value of the second order temperature coefficient $\beta$ is as little as about one-fifth to one-fourth that of the Lame mode quartz crystal resonator of the prior art.

Figure 4:
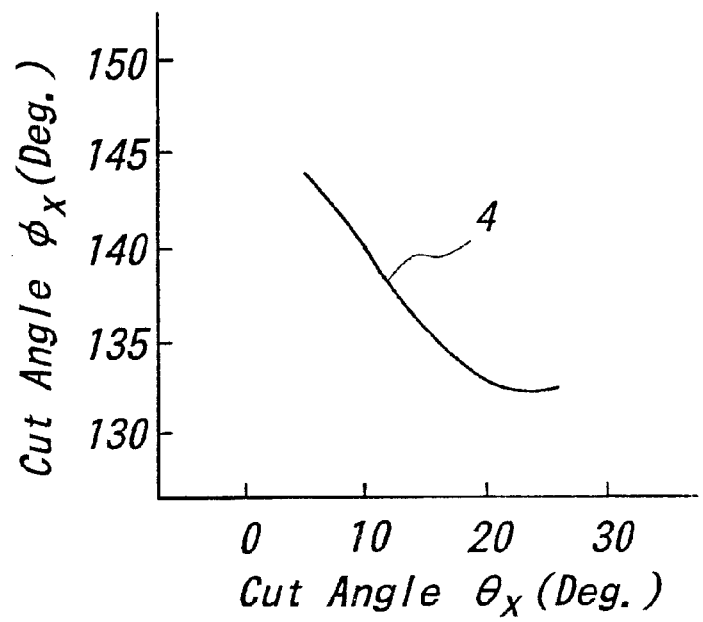
FIG. 4 is a diagram illustrating another relation between cutting angles $\phi_x$ and $\theta_x$ to obtain the zero temperature coefficient of the Lame mode quartz crystal resonator according to the invention.
Figure 5:
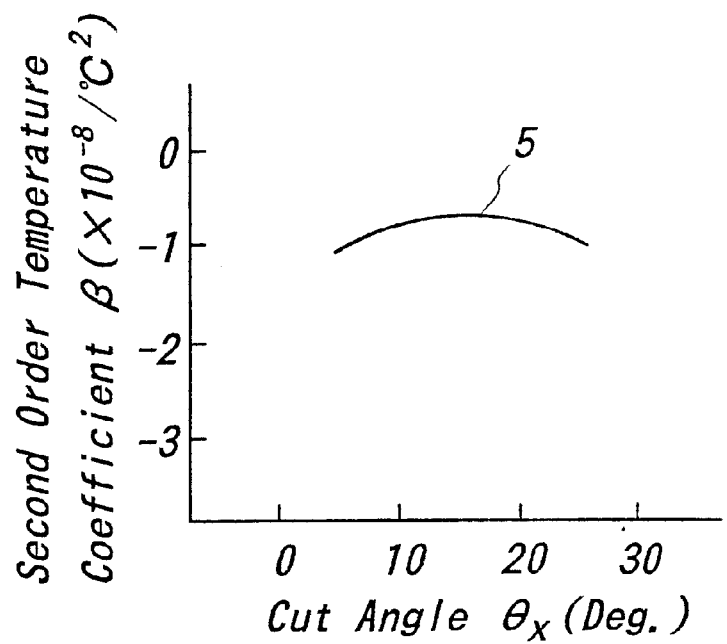
FIG. 5 is a diagram illustrating the relation between the cutting angles $\theta_x$ and second order temperature coefficient $\beta$ according to the invention.

FIG. 4 illustrates another relation between the cut angles $\phi_x$ and $\theta_x$ giving the zero temperature coefficient to the Lame mode quartz resonator according to the invention. With a curve 4 in FIG. 4, the zero temperature coefficient exists within a range of 133° to 143.5° of the cut angle $\phi_x$ and 5° to 25° of the cut angle $\theta_x$. FIG. 5 illustrates a relation between the cut angle $\theta_x$ and a second order temperature coefficient $\beta$ under the relation shown in FIG. 4. As shown in a curve 5 in FIG. 5, the absolute value of the second order temperature coefficient $\beta$ is considerably small as $-1 \times 10^{-8}/°C.^2$ within the range of 5° to 25° of the cut angle $\theta_x$ corresponding to 133° to 143.5° of the cut angle $\phi_x$.

Figure 6:
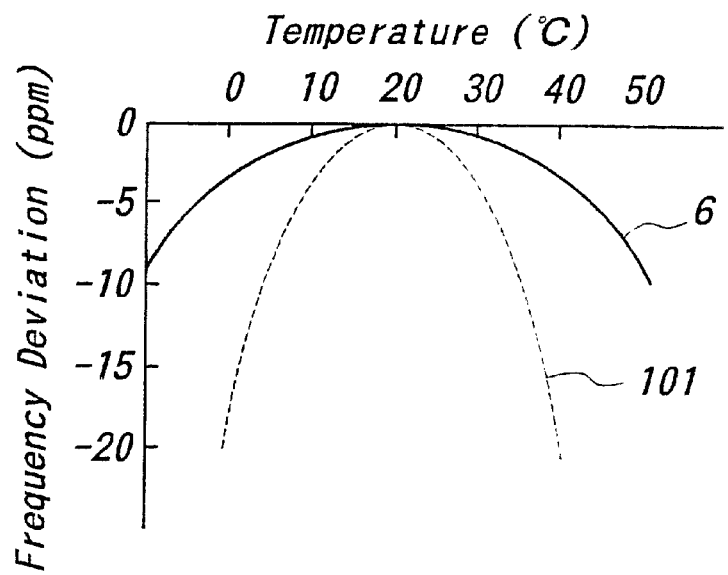
FIG. 6 is a characteristic curve illustrating one example of the frequency temperature behavior of the Lame mode quartz crystal resonator according to the invention.
Figure 7:
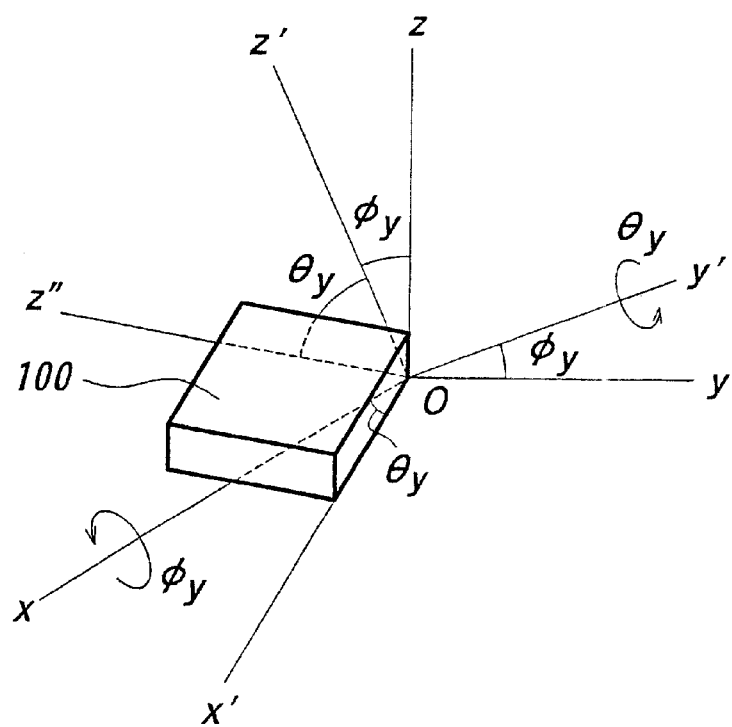
FIG. 7 is an explanatory view illustrating a Lame mode quartz crystal resonator of the prior art and its coordinate system.
Figure 8:
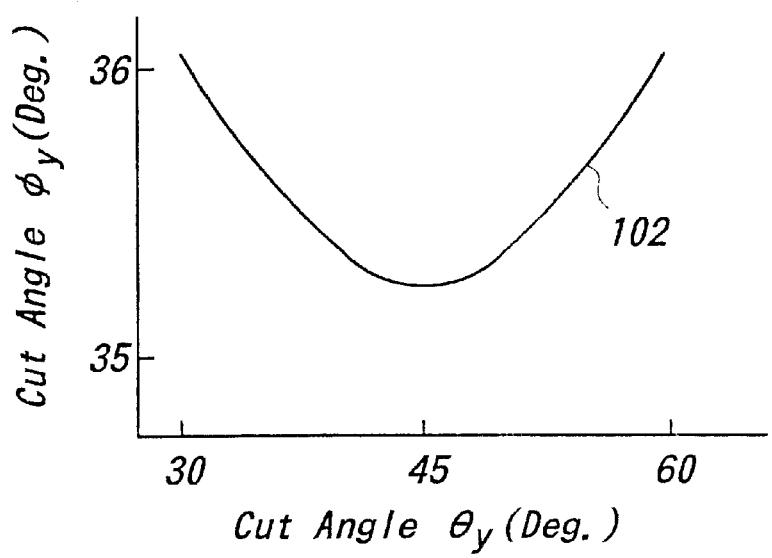
FIG. 8 is a diagram illustrating a relation between cutting angles $\phi_y$ and $\theta_y$ to obtain the zero temperature coefficient of the lame mode quartz crystal resonator of the prior art.
Figure 9:
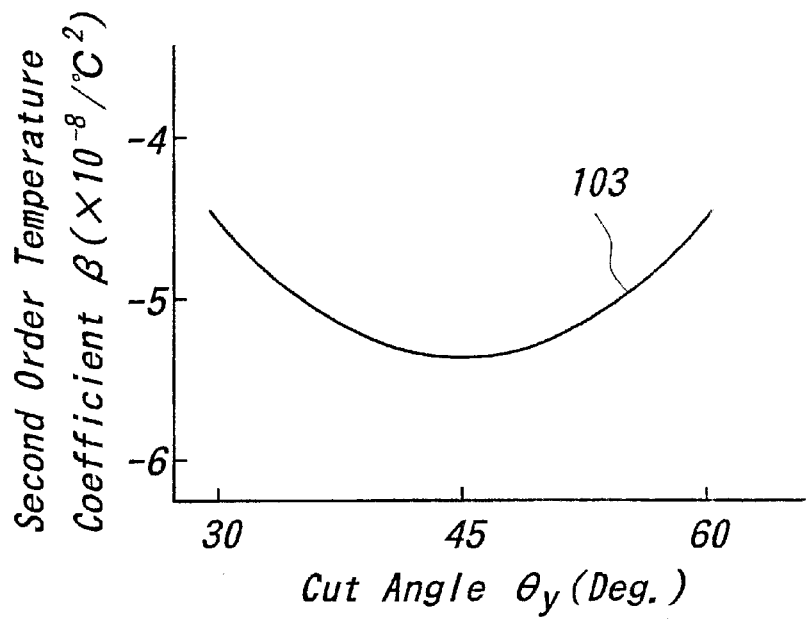
FIG. 9 is a diagram illustrating the relation between the cutting angle $\theta_y$ and second order temperature coefficient $\beta$ of the prior art.

FIG. 6 illustrates one embodiment of the frequency temperature behavior of the Lame mode quartz crystal resonator in that the cut angle $\phi_x$ is 47° and the cut angle $\theta_x$ is 65°, whose behavior is shown in the curve 6. With the Lame mode quartz crystal resonator according to the invention, the change in frequency is less over a wide temperature range as shown in the curve 6 in FIG. 6 because the absolute value of the second order temperature coefficient $\beta$ is much smaller than that of the Lame mode quartz crystal resonators of the prior art. The curve 101 shows the frequency temperature behavior of the Lame mode quartz crystal resonator of the prior art, from which it is clear that the Lame mode quartz crystal resonator according to the invention is superior to that of the prior art.

Embodiment 2

Figure 10:
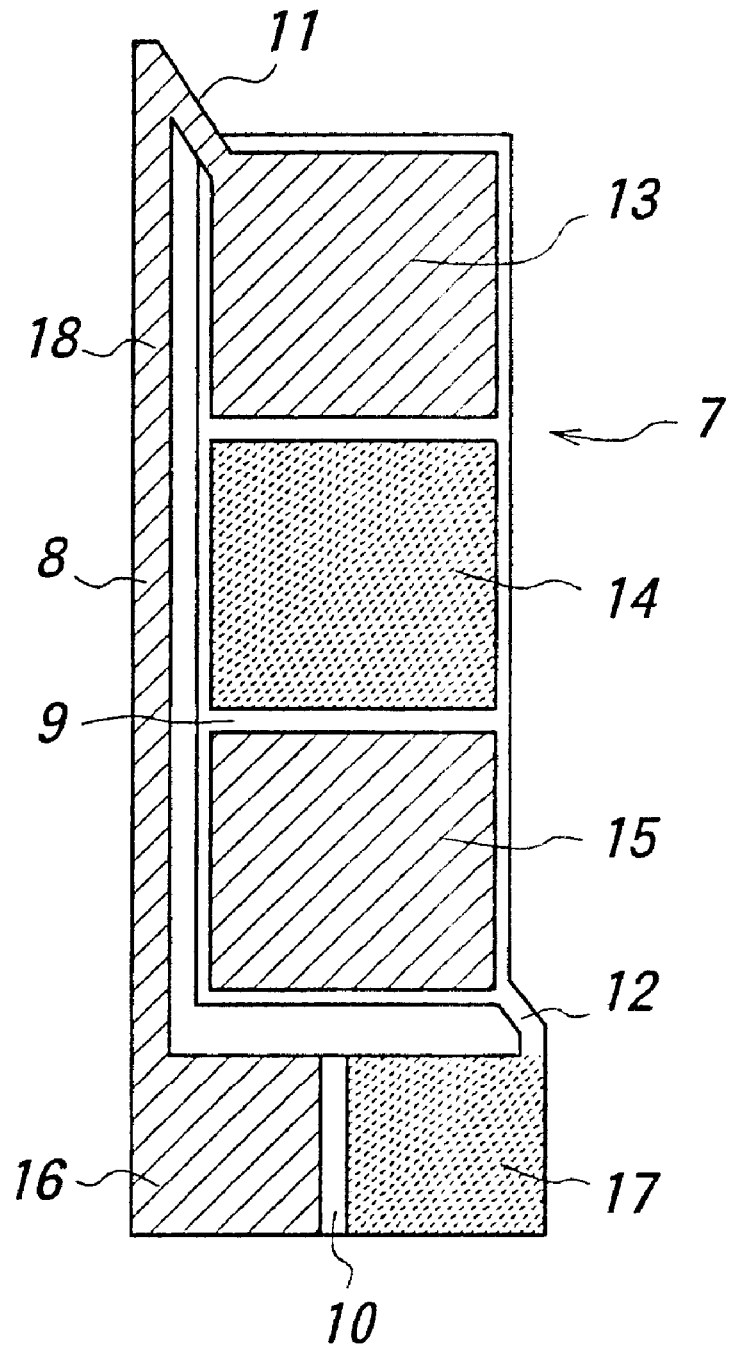
FIG. 10 is a front elevation illustrating one embodiment of the overtone Lame mode quartz crystal resonator according to the invention.

FIG. 10 illustrates an overtone Lame mode quartz crystal resonator as one embodiment of the invention in a front elevation. The quartz crystal resonator 7 comprises a vibrating portion 9, a supporting frame 8, a mounting portion 10, and connecting portions 11 and 12, all of them being formed integrally. The vibrating portion 9 is connected through the connecting portion 11 to the supporting frame 8 and through the connecting portion 12 to the mounting portion 10. The connecting portions 11 and 12 are provided at the diagonal ends of the vibrating portion 9, respectively.

In this shown embodiment, electrodes 13, 14 and 15 are disposed in the longitudinal direction of the vibrating portion 9 so that the electrodes adjacent each other will form the different polarity. In other words, the electrode portion is divided into three electrodes. This resonator vibrates in an overtone mode of (3 and 1). The electrode 13 is connected through an electrode 18 disposed on the supporting frame 8 to an electrode terminal 16 disposed on the mounting portion 10. The electrodes 13 and 15 are connected through their side surfaces (not shown) to each other. Moreover, the electrode 14 is arranged to have the same polarity as an electrode terminal 17.

As the quartz crystal resonator according to the invention includes two connections between the supporting frame 8 and the mounting portion 10 respectively and the vibrating portion 9, it is possible to minimize the vibrational energy losses of the vibrating portion. As a result, the invention provides the Lame mode quartz crystal resonator having less series resistance $R_1$ and high quality factor Q. Because the connecting portions 11 and 12 are provided at the opposite ends and on the diagonal line of the vibrating portion 9, this resonator is not susceptible to shock loads.

Figure 11:
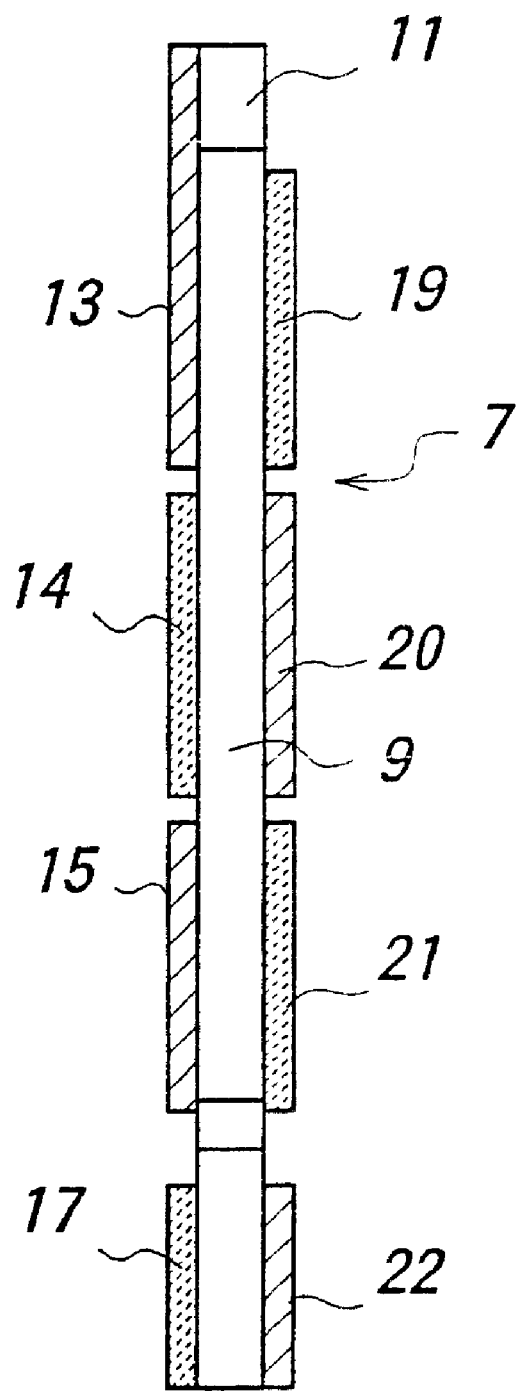
FIG. 11 is a right side view of the Lame mode quartz crystal resonator shown in FIG. 10.

FIG. 11 is a right side view of the resonator shown in FIG. 10. The vibrating portion 9 has on its rear side electrodes 19, 20 and 21 disposed in opposition to the electrodes 13, 14 and 15 on the front side. The electrodes 13, 15 and 20 and electrode terminals 16 and 22 have the same polarity, and further the electrodes 14, 19 and 21 and the electrode terminal 17 have the same polarity to form two electrode terminals electrically. When an alternating voltage is applied to the two electrode terminals 16 and 17, the parts of the vibrating portion on which the respective electrodes are disposed are repeatedly vibrated in a manner expanding and contracting in their length and width directions, that is to say, the parts vibrate in different phases.

Embodiment 3

Figure 12:
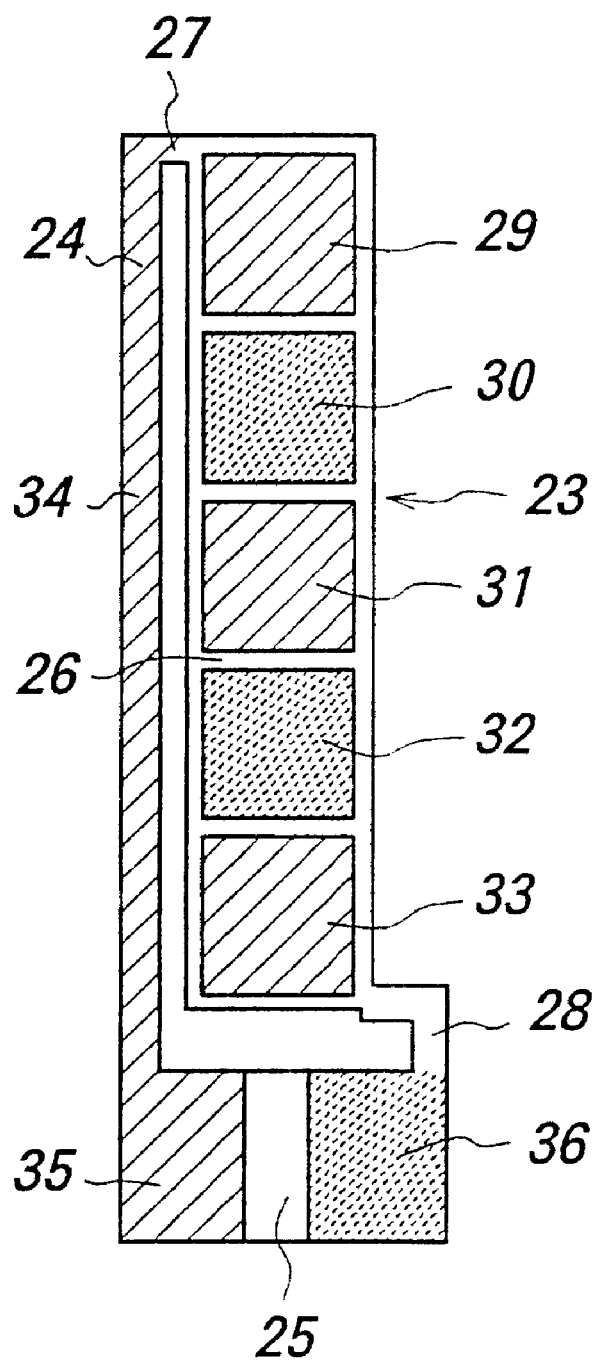
FIG. 12 is a front elevation illustrating another embodiment of the overtone Lame mode quartz crystal resonator according to the invention.

FIG. 12 illustrates another embodiment of the overtone Lame mode quartz crystal resonator according to the invention in a front elevation. The quartz crystal resonator 23 comprises a vibrating portion 26, a supporting frame 24, a mounting portion 25, and connecting portions 27 and 28. Disposed on the front surface of the vibrating portion 26 are electrodes 29, 30, 31, 32 and 33, and the electrodes adjacent each other form the different polarity. In this embodiment, whole the electrode portion is divided into five electrodes. Consequently, this resonator vibrates in an overtone mode of (5 and 1). The electrode 29 is connected through the connecting portion 27 to an electrode 34 disposed on the supporting frame 24 and further to an electrode terminal 35 of the mounting portion 25. On the other hand, the electrodes 30 and 32 are connected to an electrode terminal 36 to form two electrode terminals.

With this embodiment, also the vibrating portion 26 is connected to the supporting frame 24 and the mounting portion 25 at two connection portions 27 and 28 so that the vibrational energy of the vibrating portion 26 is not transmitted all the way to the mounting portion 25. Accordingly, it is possible to minimize the vibrational energy losses. As a result, the invention provides the Lame mode quartz crystal resonator having less series resistance $R_1$ and high quality factor Q.

Figure 13:
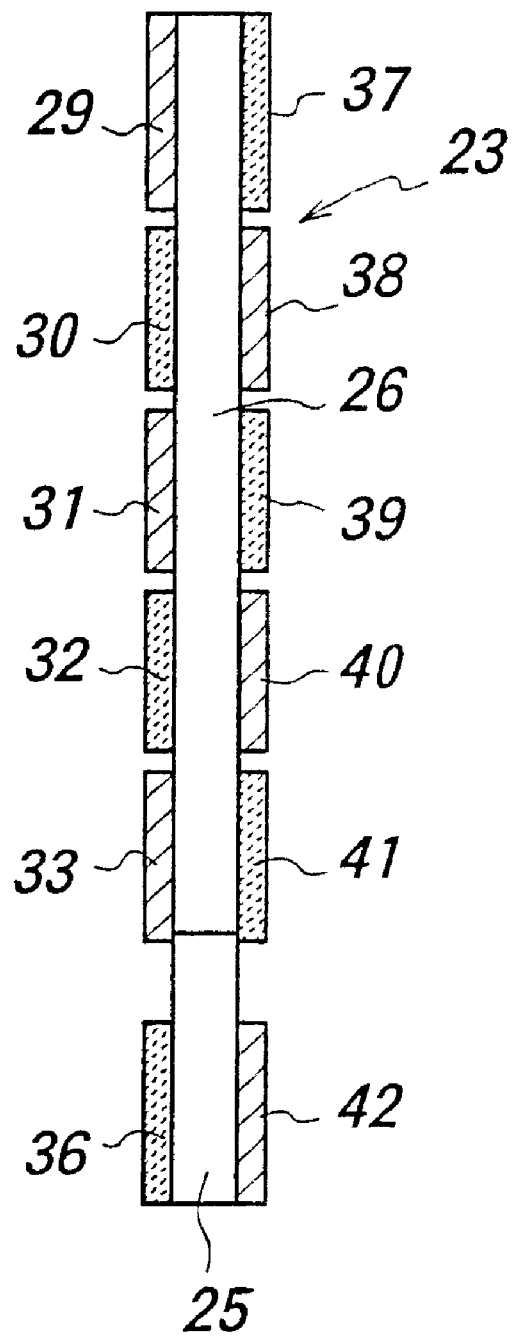
FIG. 13 is a right side view of the Lame mode quartz crystal resonator shown in FIG. 12.

FIG. 13 illustrates in a side view the resonator 23 shown in FIG. 12. The vibrating portion 26 has electrodes 29, 31, 33, 38 and 40 forming the same polarity on the one hand, and electrodes 30, 32, 37, 39 and 41 forming the same polarity on the other hand. These electrodes are connected to the electrode terminals 35 and 42 and the electrode terminal 36. These electrodes forming the same polarity are connected through the side surfaces or upper and lower surfaces of the vibrating portion in a manner not shown in FIG. 13.

Although the overtone mode of (5 and 1) is explained in this embodiment, it will be apparent that a Lame mode quartz crystal resonator vibrating in an overtone mode of (n and 1) can be realized by dividing a long electrode into an odd number of electrodes (such as 7, 9, 11 . . . n).

Embodiment 4

Figure 14:
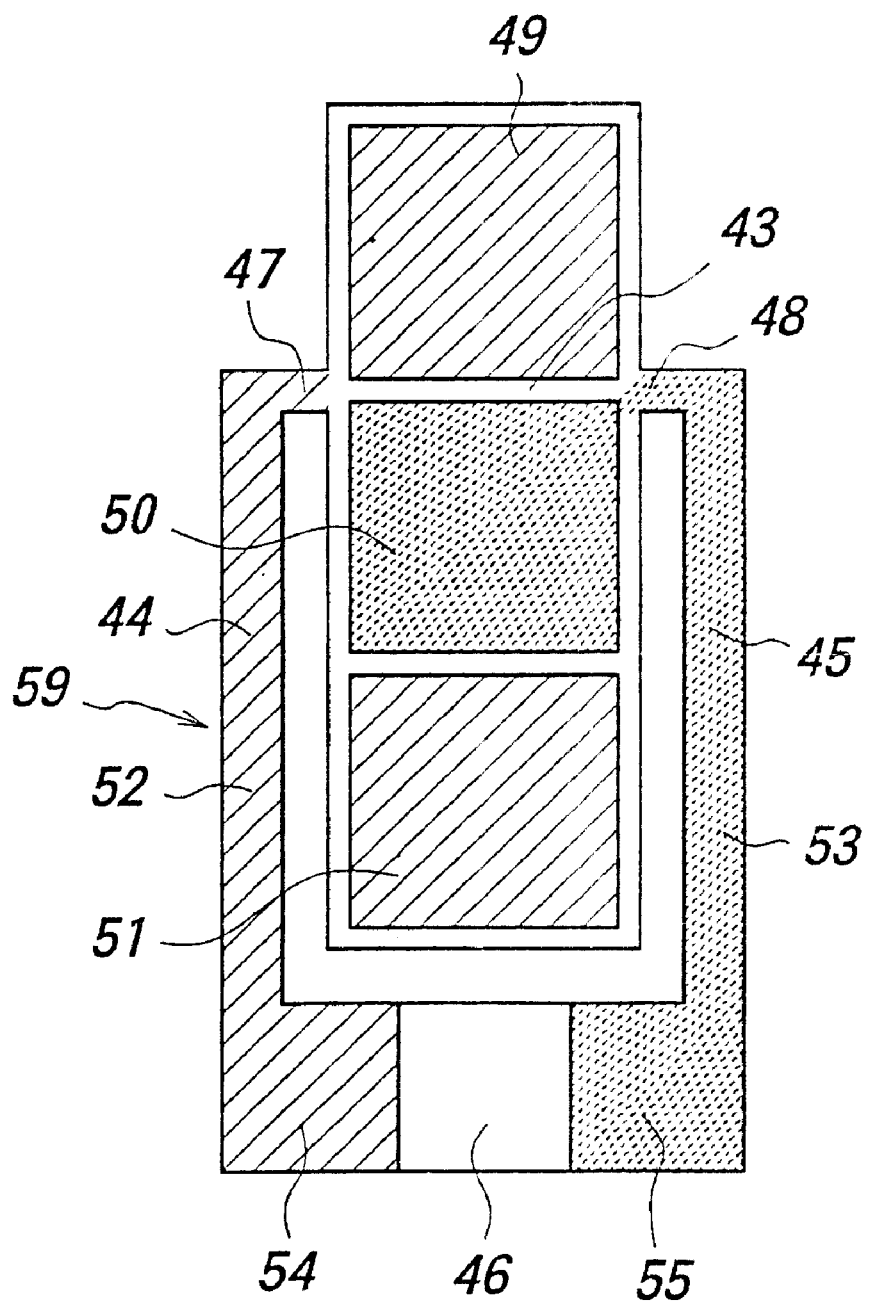
FIG. 14 is a front elevation illustrating a further embodiment of the Lame mode quartz crystal resonator according to the invention.

FIG. 14 illustrates a further embodiment of the overtone Lame mode quartz crystal resonator according to the invention in a front elevation. The quartz crystal resonator 59 comprises a vibrating portion 43, supporting frames 44 and 45, a mounting portion 46, and connecting portion 47 and 48. Electrodes 49, 50, and 51 are disposed on the front surface of the vibrating portion 43. Therefore, this resonator 59 vibrates in an overtone mode of (3 and 1). The electrodes 49 and 51 are connected to form the same polarity. The electrode 49 is connected through the connecting portion 47 to an electrode 52 disposed on the supporting frame 44 and further the electrode 52 is connected to an electrode terminal 54 of the mounting portion 46.

On the other hand, the electrode 50 extends through an electrode 53 disposed on the supporting frame 45 to an electrode terminal 55 on the mounting portion 46. The connecting portions 47 and 48 are connected to portions of the vibrating portion 43 where the overtone mode is reversed. Moreover, the connecting portion 47 is connected to the supporting portion 44 whose end is connected to the mounting portion 46. The connecting portion 48 is connected to the supporting portion 45 whose end is connected to the mounting portion 46. As the connecting portions are provided in symmetry at the portions of the vibrating portion 43 where the overtone mode is reversed in this manner, it is possible to minimize the vibrational energy losses, resulting into less series resistance $R_1$.

Figure 15:
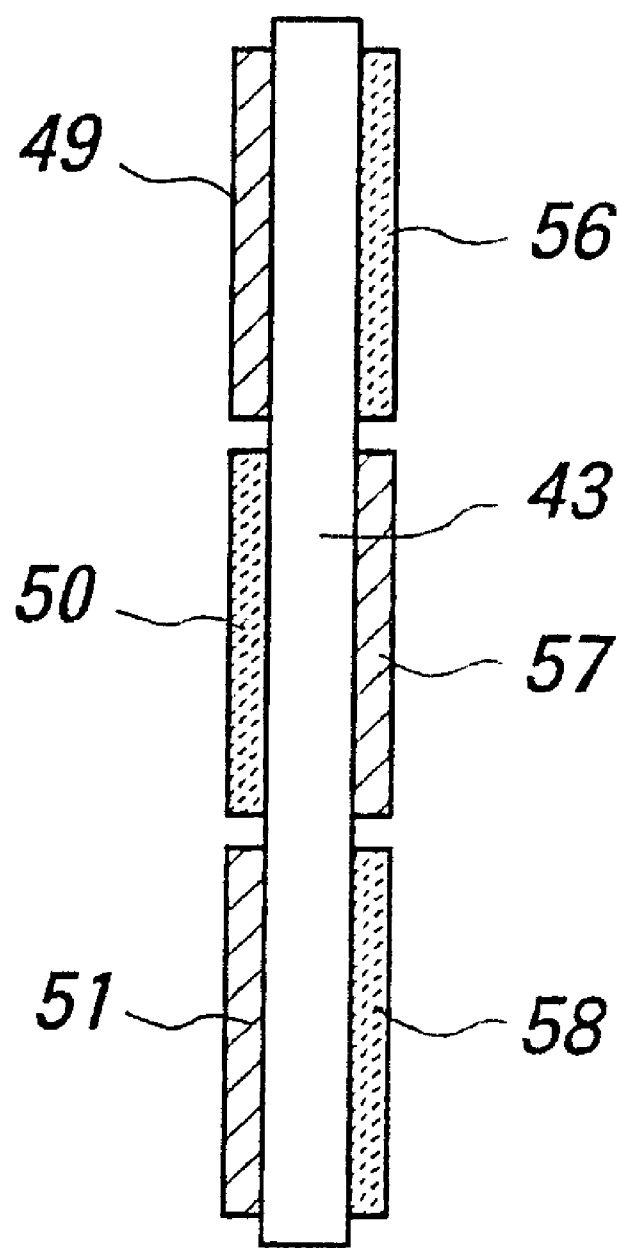
FIG. 15 is a right side view of the vibrating portion of the Lame mode quartz crystal resonator shown in FIG. 14.

FIG. 15 illustrates in a side view the resonator shown in FIG. 14. The vibrating portion 43 has electrodes 49, 51 and 57 forming the same polarity on the one hand, and electrodes 50, 56 and 58 forming the same polarity on the other hand.

Figure 16:
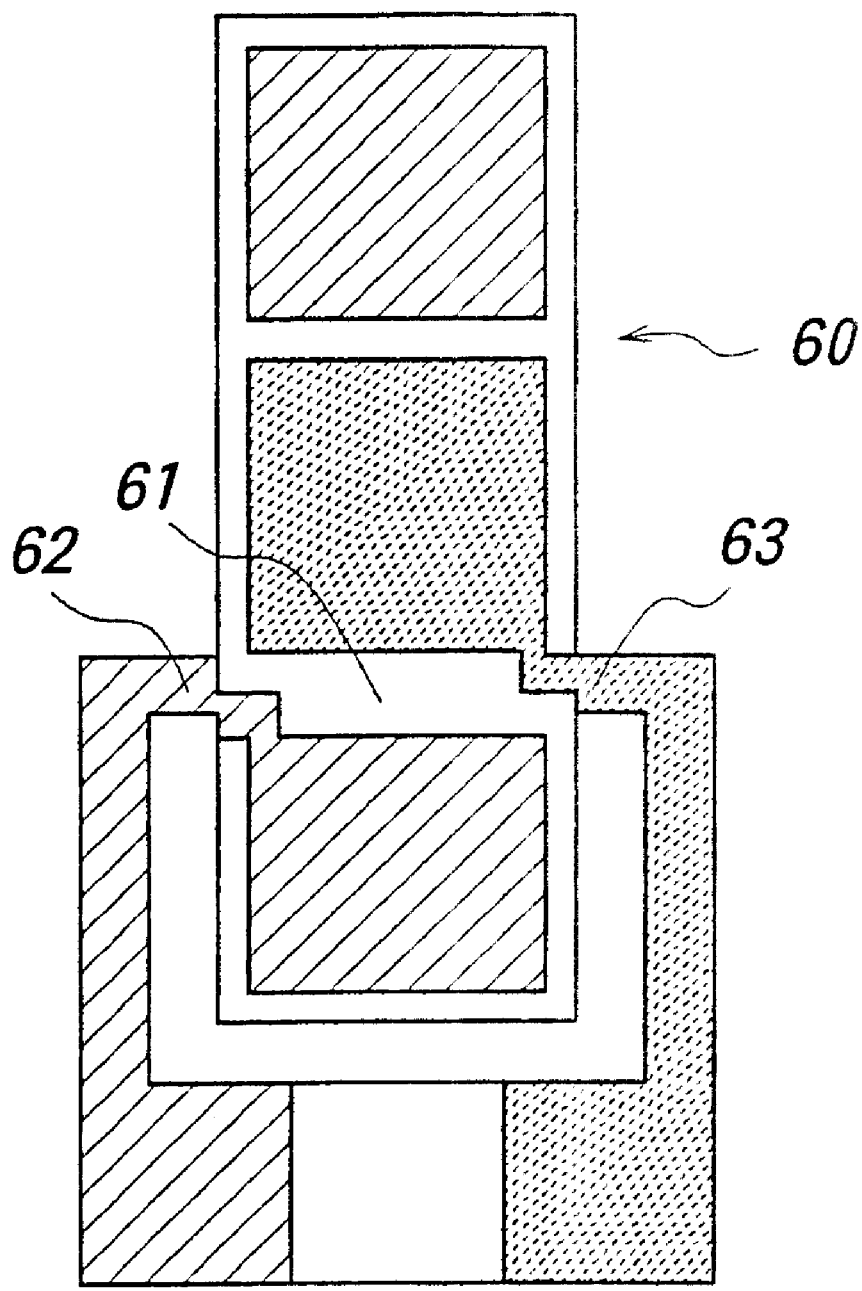
FIG. 16 is a front elevation illustrating a further embodiment of the Lame mode quartz crystal resonator according to the invention.

FIG. 16 illustrates a further embodiment of the overtone Lame mode quartz crystal resonator according to the invention in a front elevation. The vibrating portion 61 is similar in arrangement of electrodes to that shown in FIG. 14, with the exception that connecting portions 62 and 63 are connected to lower portions of the vibrating portion 61 where the overtone mode is reversed. With this arrangement, the Lame mode quartz crystal resonator 60 achieves the same effect as that of the resonator shown in FIG. 14.

While the Lame mode quartz crystal resonator of the overtone mode of (3 and 1) is explained in this embodiment, it is to be understood that the same effect can be achieved with dividing numbers of electrode such as 5, 7, . . . n. In this case, connecting portions are provided between a $\{(n-1)/2\}^{th}$ electrode and a $\{(n+1)/2\}^{th}$ electrode in the length direction of a vibrating portion, where n is 3, 5, 7 . . . n. With such a construction, any Lame mode quartz crystal resonator having five or more divided electrodes achieves the same effect as that having three divided electrodes.

Embodiment 5

Figure 17:
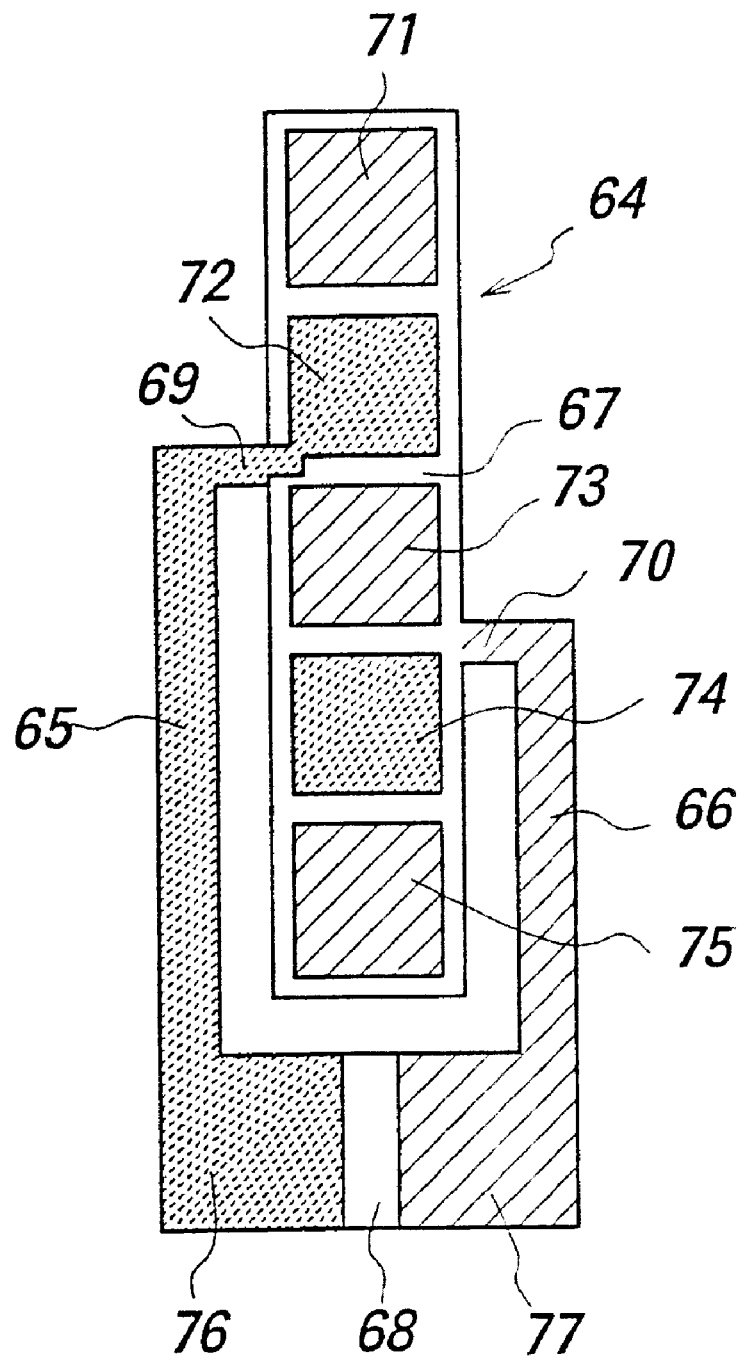
FIG. 17 is a front elevation illustrating a further embodiment of the overtone Lame mode quartz crystal resonator according to the invention.

FIG. 17 illustrates a further embodiment of the overtone Lame mode quartz crystal resonator according to the invention in a front elevation. The quartz crystal resonator 64 comprises a vibrating portion 67, supporting frames 65 and 66, a mounting portion 68, and connecting portions 69 and 70. Disposed on the front surface of the vibrating portion 67 are five divided electrodes 71, 72, 73, 74 and 75 among which the electrodes 72 and 74 form the same polarity and are connected through the supporting frame 65 to an electrode terminal 76 disposed on the mounting portion 68. The electrodes 71, 73 and 75 form the same polarity and are connected through the connecting portion 70 and supporting frame 66 to an electrode terminal 77 of the mounting portion 68. Disposed on the rear surface of the vibrating portion 67 are also five divided electrodes (not shown) forming the different polarity which is different from the polarity of the electrodes on the front surface of the vibrating portion 67.

With this embodiment, connection portions 69 and 70 are connected to the diagonal ends of the center portion of the vibrating portion 67 where the overtone is reversed. With this construction, the vibrational energy of the vibrating portion can be trapped in its interior because of the two connecting portions. As a result, the invention provides the overtone Lame mode quartz crystal resonator having less series resistance $R_1$ and high quality factor Q. Furthermore, because the connecting portions are provided in the proximity of the center of the vibrating portion, the quartz crystal resonator superior in shock resistance can be realized.

Embodiment 6

Figure 18:
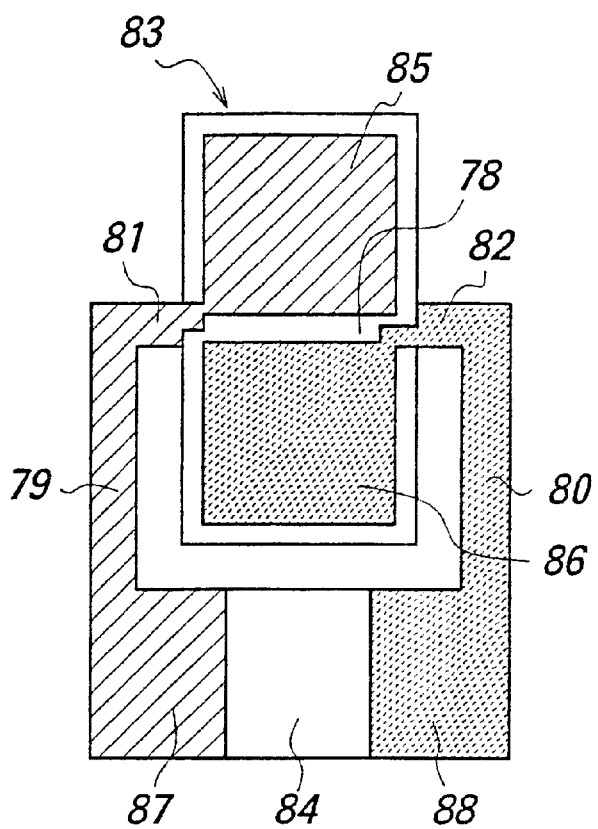
FIG. 18 is a front elevation illustrating one embodiment of the asymmetry Lame mode quartz crystal resonator according to the invention.

FIG. 18 illustrates one embodiment of the asymmetric Lame mode quartz crystal resonator according to the invention in a front elevation. The resonator in this embodiment operates in the asymmetric mode, while the resonators shown in FIGS. 10 to 17 operate in symmetric mode. The quartz crystal resonator 83 comprises a vibrating portion 78, supporting frames 79 and 80, a mounting portion 84, and connecting portions 81 and 82, all of them being formed integrally. Two divided electrodes 85 and 86 are disposed on the vibrating portion 78. The electrode 85 is connected through the connecting portion 81 and supporting frame 79 to an electrode terminal 87 of the mounting portion 84. The electrode 86 is connected through the connecting portion 82 and supporting frame 80 to an electrode terminal 88. Namely, the resonator forms two electrode terminals 87 and 88.

When a voltage is applied between the two electrode terminals, the vibrating portion vibrates in a manner that its ends in the length direction displace in the same direction and ends in the width direction displace in phase different by 180° from that in the length direction. In the case of the asymmetric mode resonator, an electrode portion is so divided that an even number of divided electrodes are disposed in the length direction. In this embodiment, the two divided electrodes are shown and the connecting portions 81 and 82 are connected to side portions of the center of the vibrating portion 78. Even if the dividing number is increased as 4, 6, 8, . . . , the positions of the connecting portions are unchanged. With this construction, the resonator can be obtained which is superior in shock resistance and has less series resistance $R_1$ and high quality factor Q.

Figure 19:
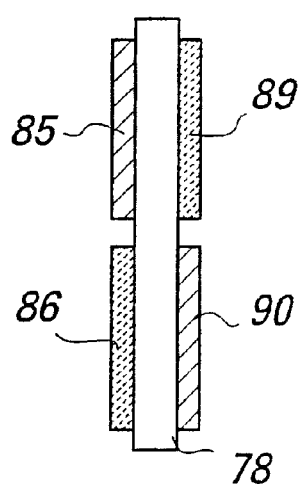
FIG. 19 is a right side view of the vibrating portion of the resonator shown in FIG. 18.
Figure 20:
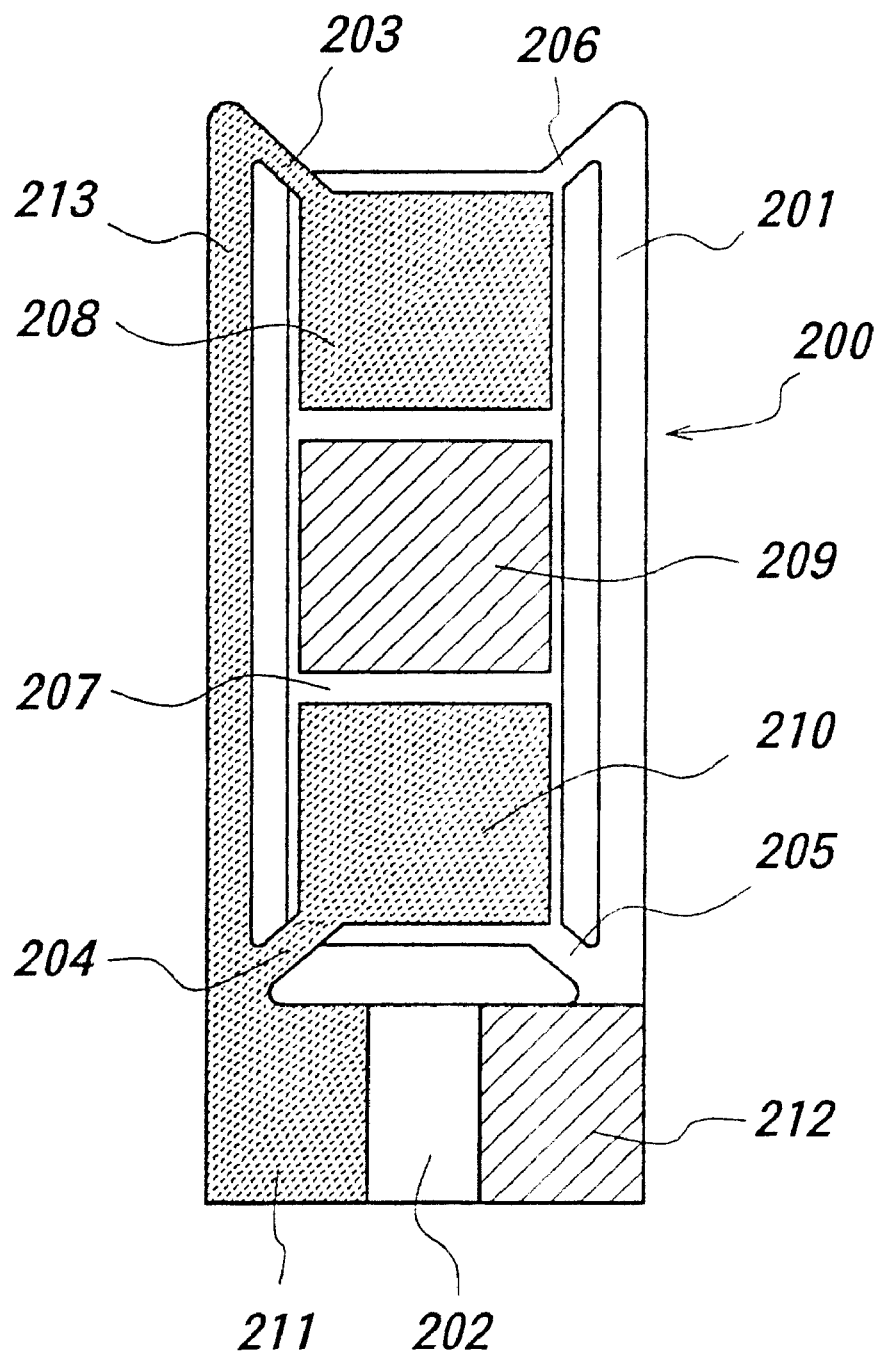
FIG. 20 is a front elevation illustrating an overtone Lame mode quartz crystal resonator of the prior art.

FIG. 19 illustrates in a side view the vibrating portion 78 shown in FIG. 18. Disposed on the surface opposite to the electrodes 85 and 86 are electrodes 89 and 90 forming the different polarity.

Although the quartz crystal resonators described above are somewhat complicated in shape, their respective parts can be easily formed by a chemical etching process or mechanical process. While the novel resonators according to the invention are explained made of quartz crystals, it will be apparent that materials other than quartz crystals, for example, Langasite ($La_3Ga_5SiO_{15}$) may be applicable.

While the invention has been particularly shown and described with reference to preferred embodiments thereof, it will be understood by those skilled in the art that the foregoing and other changes in form and detailed can be made therein without departing from the spirit and scope of the invention.

What is claimed is:

1. A quartz crystal resonator vibrating in Lame-mode, wherein the cutting angle of said resonator is in the range of xzwt(36.5° to 47°)/(65° to 85°).

2. A quartz crystal resonator vibrating in Lame-mode, wherein the cutting angle of said resonator is in the range of xzwt(133° to 143.5°)/(5° to 25°).

3. A Lame-mode quartz crystal resonator comprising:
   a vibrational portion, connecting portions, at least one supporting frame and/or mounting portion that are integrally formed, at least two pairs of electrodes disposed opposite each other on upper and lower surfaces of said vibrational portion,
   adjacent electrodes having opposite electrical polarity and being spaced from each other along the length of the vibrational portion,
   said at least one supporting frame and/or said mounting portion being connected to said vibrational portion by two connecting portions,
   wherein the cutting angle of said resonator is in the range of xzwt(36.5° to 47°)/(65° to 85°).

4. The quartz crystal resonator of claim 3, wherein the two connecting portions are diagonally opposed to each other at opposite ends of said vibrational portion and the vibrational portion has an odd number of pairs of electrodes numbering three or more each of the adjacent pairs being spaced from each other along the length of the vibrational portion between the connecting portions.

5. A quartz crystal resonator according to claim 3, wherein said resonator has two supporting frames and an odd number n of electrodes, where n is greater than three, the two connecting portions are located at opposite sides of the vibrational portion between the {(n−1)/2}th electrode and the {(n+1)/2}th electrode, and two supporting frames are connected to the vibrational portion by the respective connecting portions.

6. A quartz crystal resonator according to claim 3, wherein said resonator has an odd number n of electrodes, where n is greater than three, a first connecting portion is located at one side portion located between the {(n−1)/2}th and the {(n+1)/2}th electrodes, the other connecting portion is located on the opposite side and two supporting frames are connected to the vibrational portion by the respective connecting portions.

7. A quartz crystal resonator according to claim 3, wherein said resonator vibrates in asymmetric mode, said resonator having two pairs of electrodes and two frames that are connected to the vibrational portion by the two connecting portions located at opposing sides of the vibrational portion between the electrodes.

8. A Lame-mode quartz crystal resonator comprising:
   a vibrational portion, connecting portions, at least one supporting frame and/or mounting portion that are integrally formed, at least two pairs of electrodes disposed opposite each other on upper and lower surfaces of said vibrational portion, adjacent electrodes having opposite electrical polarity and being spaced from each other along the length of the vibrational portion, said at least one supporting frame and/or said mounting portion being connected to said vibrational portion by two connecting portions, wherein the cutting angle of said resonator is in the range of xzwt(133° to 143.5°)/(5° to 25°).

9. The quartz crystal resonator of claim 8, wherein the two connecting portions are diagonally opposed to each other at opposite ends of said vibrational portion and the vibrational portion has an odd number of pairs of electrodes numbering three or more each of the adjacent pairs being spaced from each other along the length of the vibrational portion between the connecting portions.

10. The quartz crystal resonator of claim 8, wherein said resonator has two supporting frames and an odd number n of electrodes, where n is greater than three, the two connecting portions are located at opposite sides of the vibrational portion between the $\{(n-1)/2\}$th electrode and the $\{(n+1)/2\}$th electrode, and two supporting frames are connected to the vibrational portion by the respective connecting portions.

11. The quartz crystal resonator of claim 8, wherein said resonator has an odd number n of electrodes, where n is greater than three, a first connecting portion is located at one side portion located between the $\{(n-1)/2\}$th and the $\{(n+1)/2\}$th electrodes, the other connecting portion is located on the opposite side and two supporting frames are connected to the vibrational portion by the respective connecting portions.

12. The quartz crystal resonator of claim 8, wherein said resonator vibrates in asymmetric mode, said resonator having two pairs of electrodes and two frames that are connected to the vibrational portion by the two connecting portions located at opposing sides of the vibrational portion between the electrodes.

* * * * *